United States Patent
Male et al.

(10) Patent No.: US 11,227,986 B2
(45) Date of Patent: Jan. 18, 2022

(54) THERMO-ELECTRIC CONTROLLED SWITCHING CIRCUIT

(71) Applicant: TEXAS INSTRUMENTS INCORPORATED, Dallas, TX (US)

(72) Inventors: Barry Jon Male, San Francisco, CA (US); Henry Litzmann Edwards, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 255 days.

(21) Appl. No.: 16/206,498

(22) Filed: Nov. 30, 2018

(65) Prior Publication Data

US 2020/0176659 A1 Jun. 4, 2020

(51) Int. Cl.
| | |
|---|---|
| *H01L 35/30* | (2006.01) |
| *H01L 35/32* | (2006.01) |
| *H03K 17/605* | (2006.01) |
| *H03K 17/567* | (2006.01) |
| *H03K 17/689* | (2006.01) |
| *H01L 27/16* | (2006.01) |

(52) U.S. Cl.
CPC .............. *H01L 35/30* (2013.01); *H01L 27/16* (2013.01); *H01L 35/32* (2013.01); *H03K 17/567* (2013.01); *H03K 17/605* (2013.01); *H03K 17/689* (2013.01)

(58) Field of Classification Search
CPC ......... H01L 35/30; H01L 35/32; H01L 27/16; H03K 2017/515; H03K 17/567; H03K 17/605; H03K 17/689
See application file for complete search history.

(56) References Cited

U.S. PATENT DOCUMENTS

| | | | | |
|---|---|---|---|---|
| 6,013,935 A | * | 1/2000 | Shie | H01L 27/16 257/469 |
| 6,066,902 A | * | 5/2000 | Maurio | H01L 35/32 307/117 |
| 9,496,313 B2 | * | 11/2016 | Edwards | H01L 27/16 |
| 10,644,495 B2 | * | 5/2020 | Male | H02H 3/085 |
| 2007/0125414 A1 | * | 6/2007 | Bettencourt | G05F 3/205 136/205 |
| 2009/0052214 A1 | * | 2/2009 | Edo | H03K 17/567 363/123 |
| 2009/0056345 A1 | * | 3/2009 | Edwards | H01L 27/16 62/3.7 |
| 2011/0023929 A1 | * | 2/2011 | Edwards | H01L 27/16 136/212 |

FOREIGN PATENT DOCUMENTS

| | | | | |
|---|---|---|---|---|
| DE | 3311436 A1 | * | 10/1984 | ............ H01L 27/16 |
| JP | 2009268003 A | * | 11/2009 | |

* cited by examiner

*Primary Examiner* — Kyle J Moody
*Assistant Examiner* — Jye-June Lee
(74) *Attorney, Agent, or Firm* — Valerie M. Davis; Charles A. Brill; Frank D. Cimino (57) ABSTRACT

A system on an integrated circuit (IC) chip includes an input terminal and a return terminal. A heater coupled between the input terminal and the return terminal. A thermopile is spaced apart from the heater by a galvanic isolation region. A switch device includes a control input coupled to an output of the thermopile. The switch device is coupled to at least one output terminal of the IC chip.

7 Claims, 7 Drawing Sheets

THERMO-ELECTRIC CONTROLLED SWITCHING CIRCUIT

TECHNICAL FIELD

This disclosure relates to a thermo-electric controlled switching circuit and system.

BACKGROUND

A solid-state relay (SSR) is an electronic switch device that switches on or off when an external voltage is applied across its control terminals. SSRs consist of a sensor which responds to an appropriate input (control signal), a solid-state electronic switch device which switches power to the load circuitry, and a coupling mechanism to enable the control signal to activate the switch across a galvanic isolation barrier without mechanical parts. The SSR may be designed to switch either AC or DC to the load and serves the same function as an electromechanical relay but has no moving parts. Different types of galvanically isolated SSRs employ optical, capacitive, or inductive galvanic isolation to communicate the control signal across an isolation barrier to activate the switch. Galvanically isolated SSRs using optical, capacitive, or inductive galvanic isolation utilize a multi-chip implementation (e.g., at least two die) to provide isolated relay functionality which increases product cost and complexity.

SUMMARY

This disclosure relates to a thermo-electric isolation switching circuit and system.

In one example, a system on an integrated circuit (IC) chip includes an input terminal and a return terminal. A heater is coupled between the input terminal and the return terminal. A thermopile is spaced apart from the heater by a galvanic isolation region. A switch device includes a control input coupled to an output of the thermopile. The switch device is coupled to at least one output terminal of the IC chip.

In another example, an integrated circuit device includes a substrate and a p-doped region in the substrate. The p-doped region includes at least one p-type extension coupled to a first metallic connection. An n-doped region in the substrate includes at least one n-type extension coupled to a second metallic connection. A well interconnect is coupled to each of the first metallic connection and the second metallic connection. An intermetal dielectric region is disposed over the substrate. A series interconnect is coupled to one of the p-doped or n-doped regions. A switch device on the substrate has a control input that is coupled to the series interconnect. A heater in the intermetal dielectric region is spaced apart from the well interconnect.

In yet another example, an integrated circuit includes an input port configured to receive an input signal. A heat source is coupled to the input signal. The heat source is configured to generate thermal energy that propagates across a galvanic isolation region of the integrated circuit in response to the input signal. A thermopile is configured to generate a primary voltage output signal in response to the thermal energy received from the heat source. A switch device includes a gate input coupled to receive the primary voltage output signal from the thermopile. The switch device is configured to turn on or turn off an output port in response to the primary voltage output signal from the thermopile exceeding a threshold voltage of the switch device.

DETAILED DESCRIPTION

This disclosure relates to thermo-electric controlled switching, such as a circuit and system that is implemented as an integrated circuit (IC) chip. The IC chip employs an integrated, high efficiency, thermo-electric isolation (TEI) control to directly drive an integrated switch device, such as a solid-state relay (SSR) power metal oxide semiconductor field effect transistor (MOSFET). In an example, the IC chip employs a heater (e.g., resistor) on an input side of an intermetal dielectric galvanic isolation region of the IC to generate thermal energy in response to an input electrical signal. A large cell-count thermopile resides on the secondary side of the galvanic isolation region to receive thermal energy from the heater. For example, a high efficiency thermopile (e.g., ganged arrangement of thermoelectric generators or Seebeck element cells) is configured to collect thermal energy from across dielectric regions of the IC and convert the thermal energy into electrical energy to directly drive an on-chip switch device (e.g., a MOSFET). In this way, the IC described herein utilizes "direct drive" TEI to control and directly bias the gate of the MOSFET switch device on the IC.

In some examples, an auxiliary thermopile can be coupled to the local hot spot of the switch device (e.g., regenerative gate drive) generating gate overdrive in response to high power dissipation events from the output of the switch. The auxiliary thermopile thus provides a regenerative gate overdrive to lower on resistance (e.g., RDS-ON) of the switch device, such as during high dissipation events and to enable lower voltage-drop, latched-switch circuit implementations. Additionally or alternatively, switch protection circuits can also be provided, including overvoltage and overcurrent circuits that consume thermoelectric power only when in a protective condition (e.g., if switch voltage or current thresholds are exceeded). The IC can be fabricated to include an N/P crystalline silicon structure configured with thermal flux collecting and directing elements, such as utilizing moat processing for oxide regions, contacts, vertical interconnect access (VIAs), and metallization layers. The IC chip thus provides an efficient single chip, galvanically isolated switching solution with low pinout count for the IC.

As used herein, the term "circuit" can include a collection of active and/or passive elements that perform a circuit function, such as an analog circuit or digital circuit. Additionally or alternatively, for example, the term "circuit" can include an IC where all or some of the circuit elements are fabricated on a common substrate (e.g., semiconductor substrate, such as a die or chip), such as disclosed herein.

Figure 1:
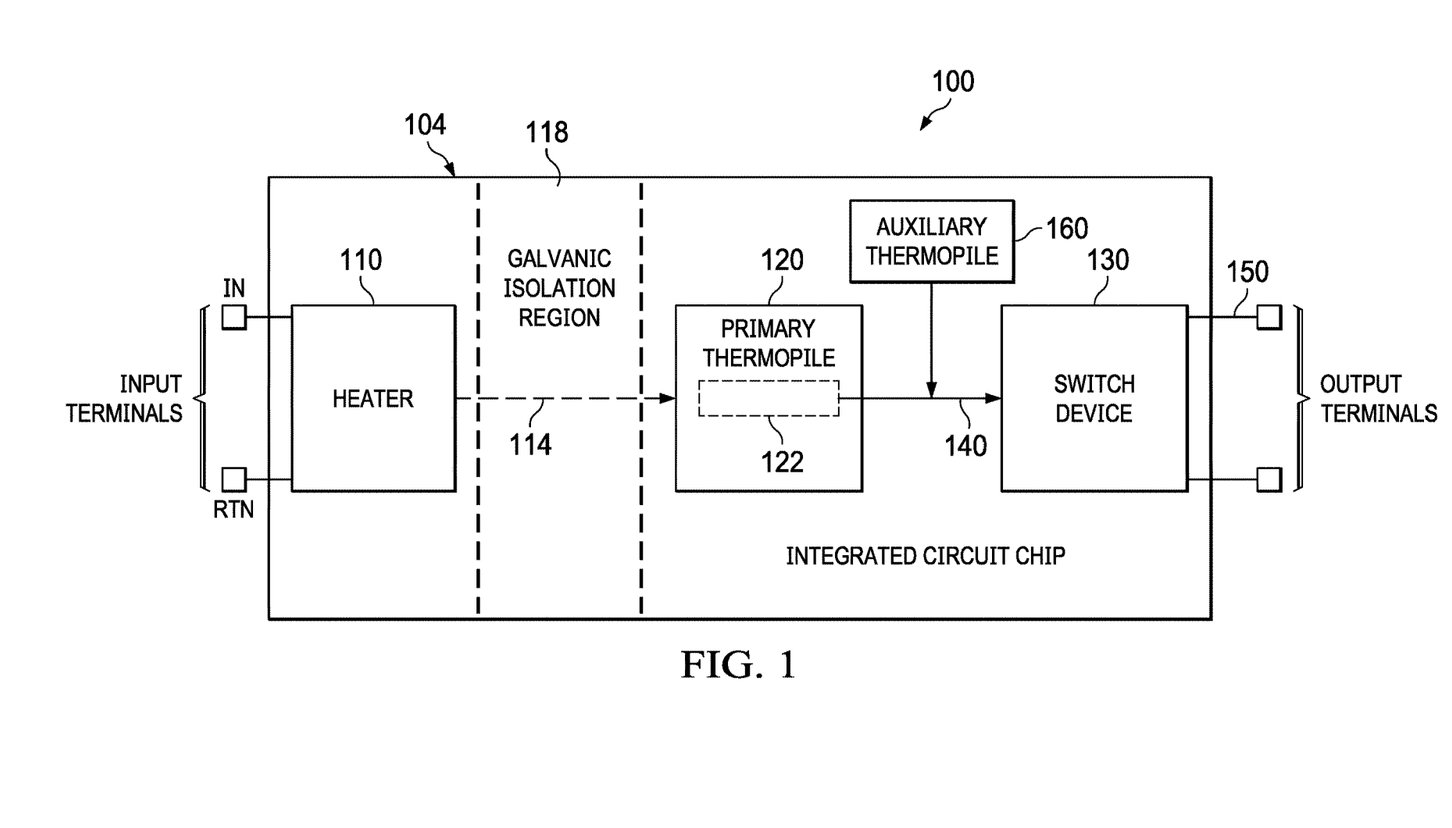
FIG. 1 illustrates an example block diagram of a system on an integrated circuit chip to provide thermo-electric controlled switching.

FIG. 1 illustrates an example of a system 100 implemented on an IC chip 104 that is configured (e.g., as a solid-state relay) to provide thermo-electric controlled switching. The IC chip 104 includes an input terminal (IN) and a return terminal (RTN). A heater 110 is coupled between the input terminal IN and the return terminal RTN. In an example, the heater 110 can be an adjustable resistor having a resistance configured in a range from about 900 ohms to about 8000 ohms. Resistor configuration can occur during process fabrication and/or additional IC pins can be installed to allow users to select desired resistance values for the heater 110 (e.g., use pins to short resistance paths to lessen an overall resistance loop). An electrical signal (not shown), such as a DC or AC signal (e.g., a square wave, sine wave, triangle wave and so forth) can be applied to the input terminals to cause the heater 110 to generate thermal energy 114 in the IC chip 104.

A primary thermopile 120 is spaced apart from the heater 110 on the IC chip 104 by a galvanic isolation region 118 (demonstrated between dashed lines). As used herein, the term galvanic isolation refers to electrically isolating functional sections of electrical systems such as the IC chip 104 to prevent current flow from the input-side portion (where the heater resides) to another portion (where other circuitry resides). That is, no direct conduction path extends across the galvanic isolation region 118. In this example, the thermal energy 114 that propagates across the galvanic isolation region 118 provides direct-drive TEI control (e.g., switch on and off signals) to directly activate or deactivate the switch device 130. The switch device 130 includes a control input 140 coupled to an output of the primary thermopile 120. The switch device 130 includes one or more outputs that are also coupled to at least one output terminal 150 of the IC chip 104.

In one example, the primary thermopile 120 can be implemented as a Seebeck device (e.g., thermoelectric generator) configured to convert heat directly into electricity. For example, the thermopile 120 includes a plurality of thermoelectric cells that are configured to generate a primary voltage to activate the switch device 130 in response to the thermal energy 114 received from the heater 110 causing the cells to generate an output voltage that exceeds a threshold of the switch device (e.g., exceeding the gate threshold of the switch device). For example, each thermoelectric cell of the primary thermopile 120 can include dissimilar metals such as n-doped and p-doped materials that are coupled via a metallic layer that when exposed to a temperature differential employ the Seebeck effect to provide a voltage at the output of the cell which is similar in nature to a thermocouple. The plurality of thermoelectric cells of the primary thermopile 120 can be configured to include from about 10,000 cells per thermopile to about 150,000 cells per thermopile to provide the desired voltage drive sufficient to activate the switch device 130. Other numbers of cells may be used in the primary thermopile 120 in other examples. At the lower end of the range for the number of cells (e.g., 10,000), less silicon area is utilized within the integrated circuit chip. At the higher end of the range (e.g., 150,000) more silicon area is utilized however thermal efficiency is improved where greater voltages are developed across the thermopile given the same amount of heat generated by the heater 110. The number of cells for the thermopile can be adjusted within the range based on silicon area and thermal gathering considerations.

In some examples, the IC chip 104 includes an auxiliary thermopile 160 that is configured to harvest thermal energy from the switch device 130 during its operation. In response to thermal energy from the switch device (heat dissipation when it is driven), the auxiliary thermopile 160 provides a secondary voltage output signal that is applied to the control input 140 and added to the primary voltage output signal of the primary thermopile 120 for activating the switch device 130. For example, the auxiliary thermopile 160 is configured to generate gate overdrive to the switch device 130 in response to heat dissipation from the switch device and adjacent circuitry in the IC (e.g., over voltage and overcurrent circuitry—not shown in FIG. 1, but see FIGS. 5 and 6). The auxiliary thermopile 160 can be configured in a similar multi-cell arrangement as the primary thermopile 120. In one example, the switch device 130 can be a two-terminal metallic oxide semiconductor field effect transistor (MOSFET). Other examples for the switch device 130 include an Insulated Gate Bipolar Transistor (IGBT), MOS Controlled Thyristor (MCT) or Integrated Gate-Commutated Thyristor (IGCT).

Figure 2A:
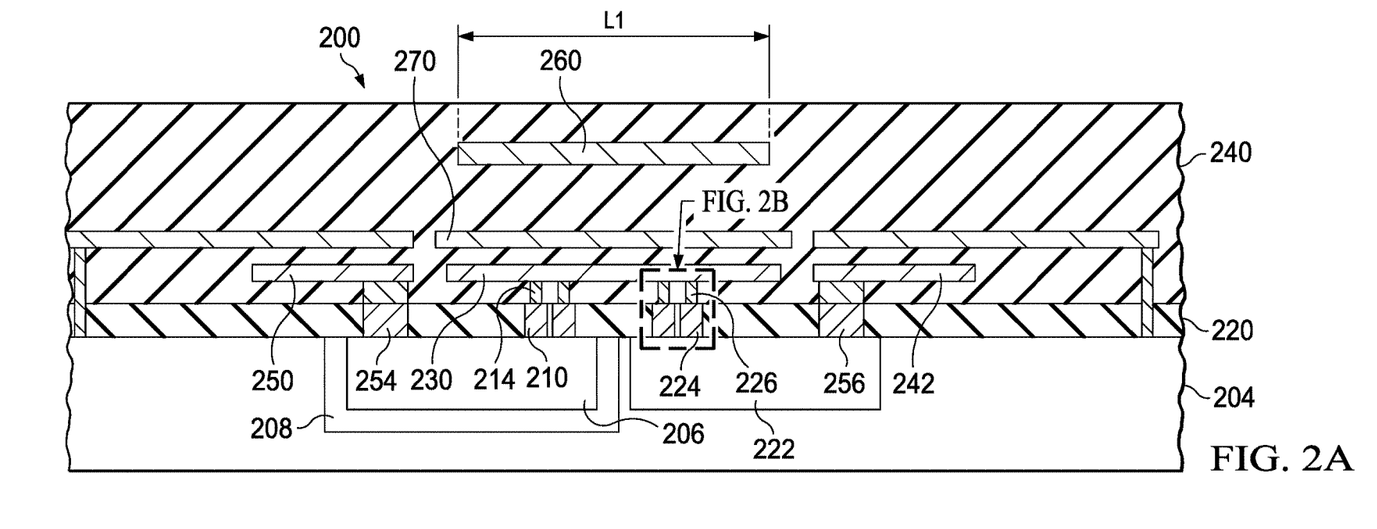
FIG. 2A illustrates an example side-view of an integrated circuit device to provide thermo-electric controlled switching.

FIG. 2A illustrates an example side-view of an IC device 200 to provide thermo-electric controlled switching. The IC device 200 includes a substrate 204 (e.g., p minus semiconductor material) and a p doped region 206 in an n region 208 in the substrate. A field oxide layer 220 is formed over the substrate, and an intermetal dielectric region 240 is disposed over the field oxide layer 220. The p doped region 206 includes a p-type extension 210 (at least one) within the field oxide layer 220. A first metallic connection 214 (e.g., tungsten connection) extends from each p-type extension 210 and is coupled to an interconnect 230 that is formed within the intermetal dielectric region 240. As shown, the p doped region 206 may be electrically isolated from the substrate 204 via the n region 208 surrounding the p doped region within the substrate 204.

An n doped region 222 is formed in the substrate 204 and includes at least one n-type extension 224 within the field oxide layer 220. A second metallic connection 226 extends from each n-type extension and is coupled to the interconnect 230. The interconnect 230 is thus coupled to each of the first metallic connection and the second metallic connection 214 and 226 respectively. The p-type extension 210 and n-type extension 224 enable the collection of heat through the intermetal dielectric region 240 by spacing the p doped region 206 materials and the n doped region 222 materials closer to the respective heater 260 as well as increasing available surface area, which aids in thermal collection efficiency of the IC device 200. In one example, each p doped or n doped region may include at least one extension. For instance, eight (or more) extensions to facilitate collection of thermal energy to the respective regions. Thermal flux is channeled down these extensions acting as standing pillars creating a temperature difference from the top to the bottom of the pillar, thus improving the efficiency of the Seebeck cell.

These pillars can potentially have a very high aspect ratio (e.g., nm's in diameter and 10's or 100's of nm tall). The pillar can be surrounded by less thermally conductive oxide (e.g., about 10× less conductive than silicon) and as such, the dominate thermal flux path is forced down the respective pillars. The n and p doped extensions (e.g., pillars) described herein promote a larger temperature difference across the extension region and thus, maximize the electrical output of the thermopile by extending from the respective doped region in a direction toward the heater to facilitate collection of the thermal energy.

A series interconnect 250, 242 is coupled to one or both of the p doped region 206 or n doped region 222 at respective extensions 254 and 256. The series interconnect 250 is utilized to allow ganging of multiple cells (each configured similarly to FIGS. 2A and 2B) to form the overall thermopile described herein in which the p doped region 206 and the n doped region 222 along with extensions 210, 254, 224, and 256 thus form one cell of the respective thermopile. The field oxide layer 220 may be formed around the p-type extension 210, first metallic connection 214, n-type extension 224, and second metallic connection 226.

A switch device (not shown) on the substrate 204 has a control input that is coupled to the series interconnect 250 (e.g., coupled with a last cell of the ganged thermopile cells). The coupling between a series interconnect 122 and the control input 140 of the switch device 130 is shown in FIG. 1. The heater 260 is formed in the intermetal dielectric region 240 spaced apart from and in an overlying spatial relationship with the interconnect 230. For example, the heater is formed as a semiconductor resistor device having a high impedance and configured to convert electrical energy (from an input electrical signal) into high thermal energy.

A faraday metal layer 270 can be interposed between the heater 260 and the interconnect. The faraday metal layer 270 can facilitate collection of thermal energy from the heater in the intermetal dielectric region 240 of the IC device 200. The faraday metal layer 270 further may surround the thermopile and associated circuitry. The faraday metal layer 270 thus can also provide an electric field shield to help electrically isolate the thermopile (p doped region 206, n doped region 222 and associated interconnects) and other associated circuitry from AC signals on the heater. As noted above, the p doped region 206, n doped region 222 and its extensions and interconnects are configured as one cell of a thermopile, where the thermopile can be configured as a Seebeck device that includes a plurality (e.g., thousands) of such cells. The cells are configured to generate a primary voltage to activate the switch device in response to thermal energy from the heater in response to the voltage exceeding a threshold of the switch device.

In other portions of the IC device 200, an auxiliary thermopile can be similarly fabricated. The auxiliary thermopile can be configured to harvest heat from the switch device when activated and to provide a secondary voltage that is applied in combination with the primary voltage to activate the switch device. As mentioned, an input terminal and a return terminal (not shown) can be provided on the IC device 200 that are configured to provide an electrical signal to the heater. A fault circuit (see e.g., FIG. 5) can be fabricated on the substrate 204 to monitor the output voltage or current provided by the switch device if activated and to deactivate the switch device if a voltage or current threshold is exceeded. The fault circuit further may be powered by the electrical voltage created by the thermopile(s) in response to thermal energy or extracted from the voltage developed across the switch due to its resistance An expanded view of the n doped region 222 is shown at 290 of FIG. 2B to illustrate thermal energy flow. The interconnect 230 (an electrically and thermally conductive material) is shown as a hotter region whereas the n region being lower in the substrate is colder. Thus, a delta T such as shown at 284 is formed between the hotter and colder regions. A similar delta T at 284 would also be formed over the p doped region 206 concurrently since each p and n regions are substantially in the same proximity to the heater 260.

Figure 2B:
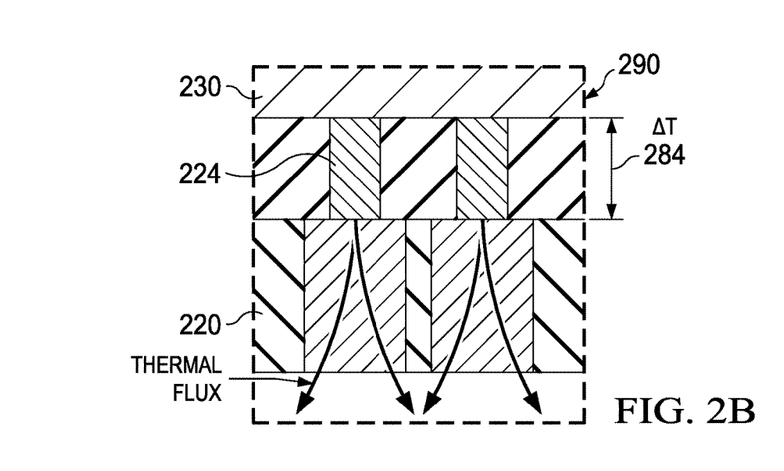
FIG. 2B illustrates an expanded view of a region of the integrated circuit device of FIG. 2A.
Figure 2C:
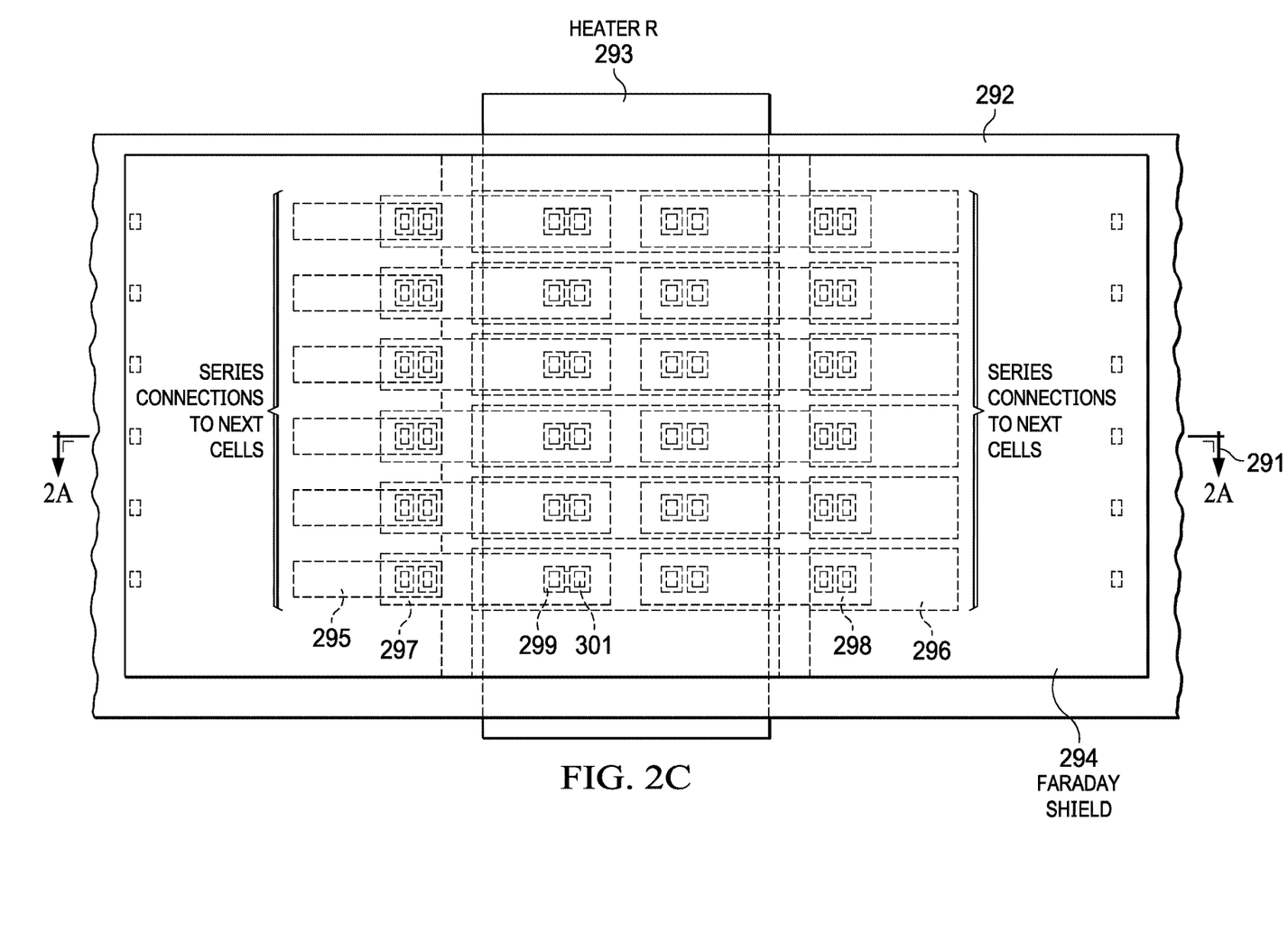
FIG. 2C illustrates an example top view of the integrated circuit device illustrated in FIG. 2A.

FIG. 2C illustrates an example top view of the integrated circuit device illustrated in FIG. 2A. A line 291 represents a cross section of a substrate 292 where the cross section of the IC device is represented in FIG. 2A. A heater 293 is shown as extended past the substrate 292 for illustrative purposes. The heater 293 is implemented as the top layer on the substrate 292 and has been extended to more easily view as the top layer. The next region implemented beneath the heater 293 is a Faraday Shield layer 294. Along the line 291, series interconnects 295 and 296 connect to respective p-doped region 297 and n-doped region 298. Each of the p-doped and n-doped regions 296 and 297 can be attached to extensions (also referred to as pillars) having a metallic interconnect. An example extension is illustrated at 299 and an example interconnect for the extension is shown at 301.

Figure 3:
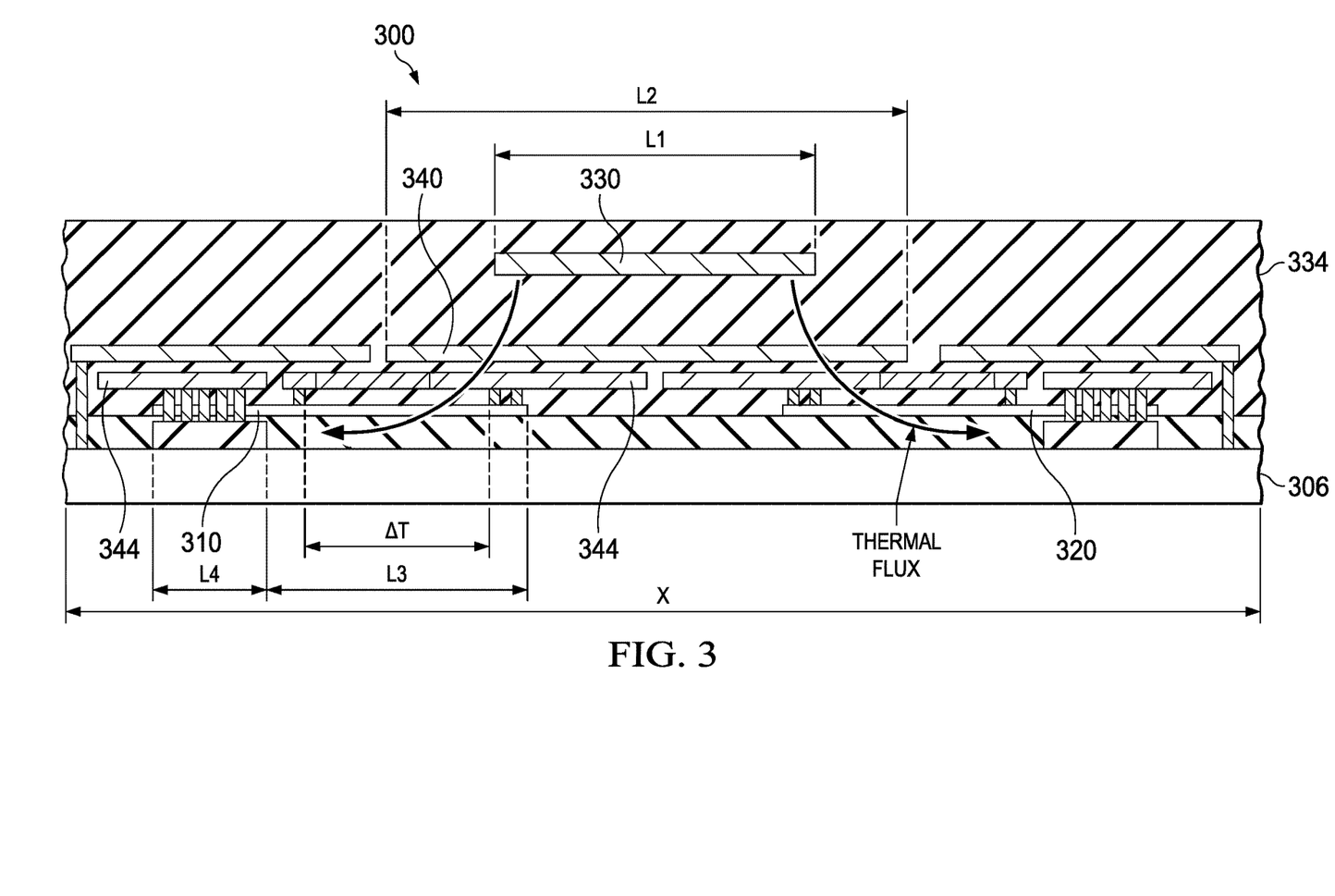
FIG. 3 illustrates an example side-view of an integrated circuit device to provide thermo-electric controlled switching utilizing an alternative configuration than the chip of FIGS. 2A and 2B.

FIG. 3 illustrates an example side-view of another integrated circuit chip 300 to provide thermo-electric-isolation to control switching utilizing an alternative thermopile configuration than the chip of FIGS. 2A and 2B. In this example, a substrate 306 includes two heat collecting regions 310 and 320 configured as polysilicon layers that are spaced apart laterally from each other with respect to the substrate along an X plane. In this example, heat flow is from a heater 330 through a dielectric region 334, through a faraday layer 340, through an interconnect 344 and to the respective heat collecting regions 310 and 320 (e.g., polysilicon layers). The thermal energy from the heater 330 flows, as shown by arrows, from the heater to the heat collecting regions 310 and 320 which are spaced apart laterally on the X plane. In this configuration, in contrast to the example of FIGS. 2A and 2B, heat collection may be more inefficient since the heat path is dispersed both in two dimensions (transversely and laterally) with respect to the heater 330.

Figure 4:
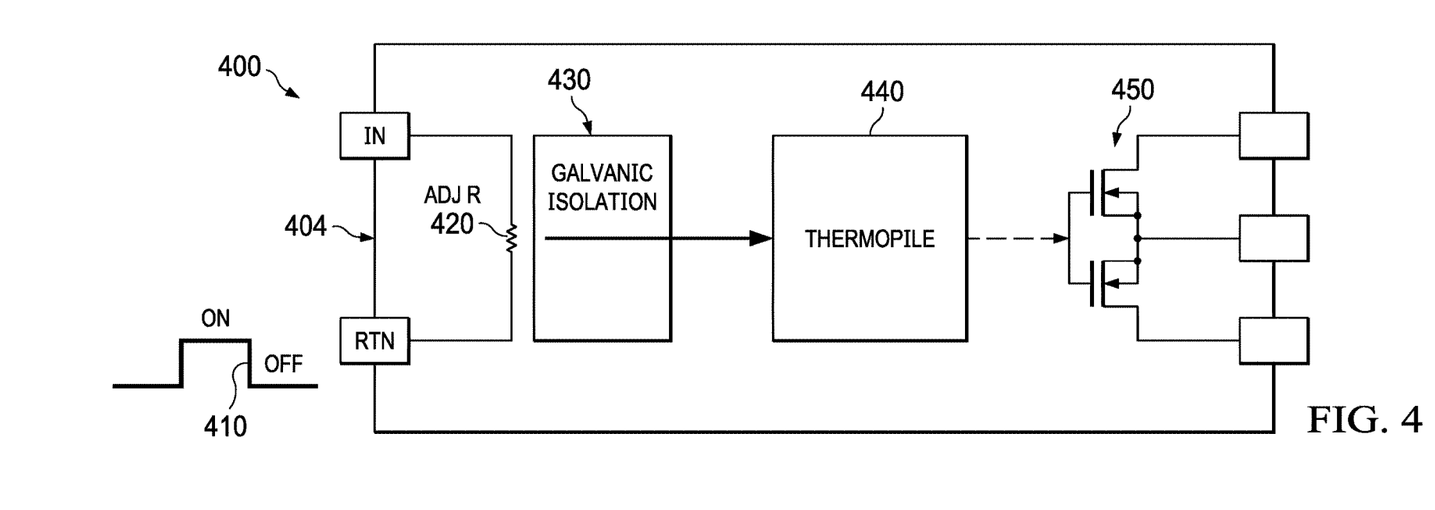
FIG. 4 illustrates an example circuit diagram of a system on an integrated circuit chip to provide thermo-electric controlled switching.

FIG. 4 illustrates an example circuit diagram of a system 400 on an integrated circuit chip 404 to provide thermo-electric galvanic isolation. In this example, an electrical signal 410 is applied to input terminals labeled IN and RTN which in turn drive a heater, which is demonstrated as an adjustable resistor 420 (e.g., having a resistance from about 900 ohms to about 8000 ohms). At the lower end of the range for the resistance (e.g., 900 ohms), less silicon area may be needed to implement the adjustable resistor 420 whereas at higher values of resistance (e.g., 8000) less current is required by external devices to drive the adjustable resistor in order to generate heat. Thermal energy from the adjustable resistor 420 propagates across a galvanic isolation region 430 and is received by a thermopile 440. The thermopile 440 generates a voltage output in response to thermal energy from the adjustable resistor 420. The thermopile 440 is coupled to drive a switch device 450 according to the voltage output. In this example, the switch device 450 includes a pair of MOSFETs coupled together forming a three terminal device which is driven directly via the thermopile 440. As mentioned, other types and configurations of switch devices may be used in other examples.

Figure 5:
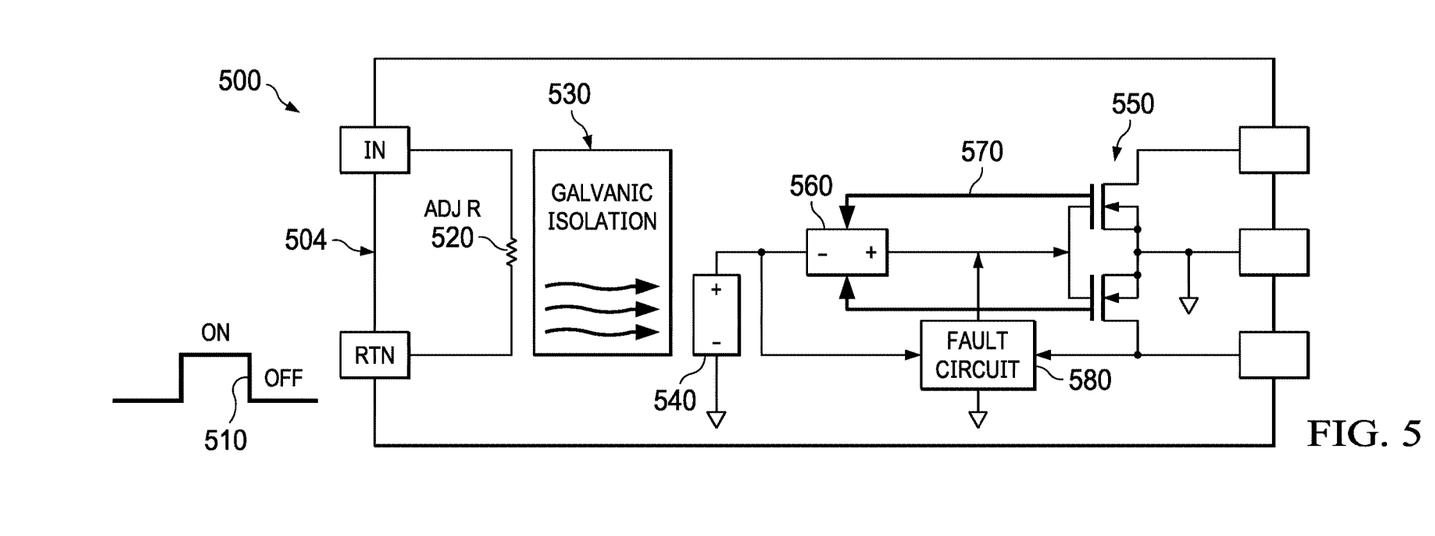
FIG. 5 illustrates an example circuit diagram of another system on an integrated circuit chip to provide thermo-electric controlled switching where an auxiliary thermopile and fault circuit is employed.

FIG. 5 illustrates an example circuit diagram of a system 500 implemented as an integrated circuit chip to provide thermo-electric-isolation controlled switching where an auxiliary thermopile is employed. Similar to the circuit described above with respect to FIG. 4, an electrical signal 510 is applied to input terminals labeled IN and RTN to drive an adjustable resistor 520. Thermal energy from the adjustable resistor 520 propagates across a galvanic isolation region 530. A primary thermopile 540 receives the thermal energy. The primary thermopile converts the thermal energy from the adjustable resistor 520 into a voltage output. The output of the primary thermopile is coupled to drive a switch device 550 based on the voltage output.

In this example, an auxiliary thermopile 560 is configured to harvest heat from the switch device 550 when activated and to provide a secondary voltage that is added to the primary voltage from the primary thermopile 540 to activate the switch device. A heat arrow at 570 is shown for illustrative purposes and shows that locally generated heat from the switch device 550 is used to drive the auxiliary thermopile 560. As shown in this example, a fault circuit 580 can be provided to monitor the output voltage or current provided by the switch device 550 when activated. The fault circuit 580 deactivates the switch device 550 if a voltage or current threshold is exceeded. An example of a fault circuit is illustrated in FIG. 6.

Figure 6:
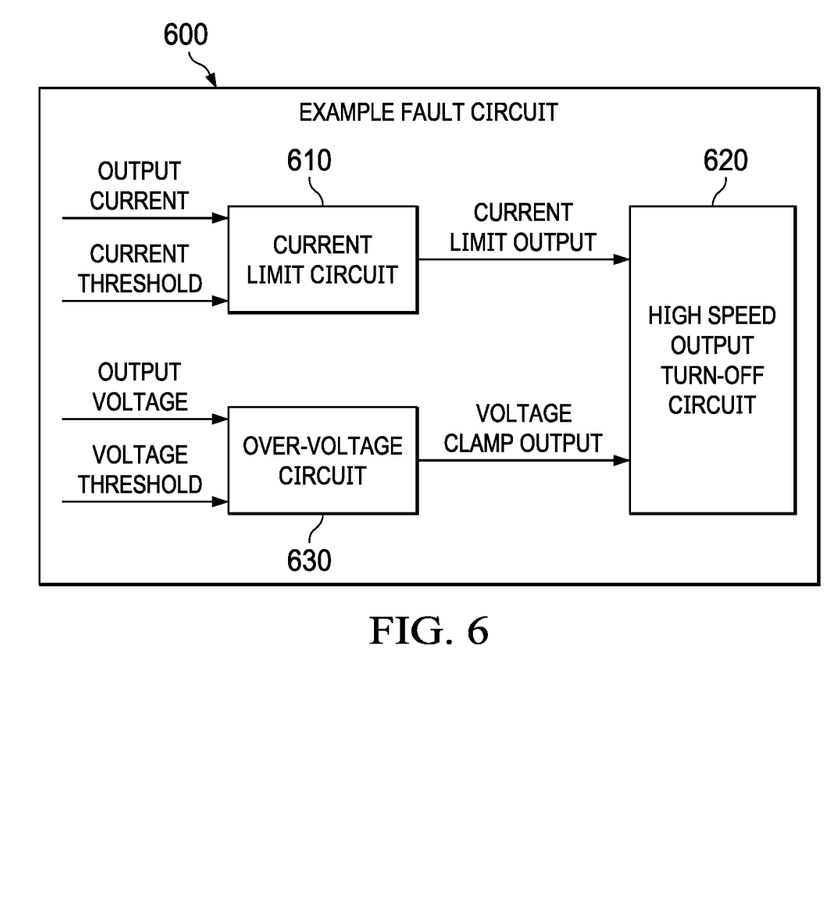
FIG. 6 illustrates an example of a fault circuit to disable a switch device on an integrated circuit chip to provide thermo-electric controlled switching.

FIG. 6 illustrates an example of a fault circuit 600 to disable a switch device on an integrated circuit chip to provide thermo-electric galvanic isolation. In this example, a current limit circuit 610 can be configured to monitor output current of the switch device (e.g., switch device 550) with respect to a current threshold. The output current can be monitored from one or more of the output terminals, for example, of the switch device 550 shown in FIG. 5. If the current of the switch device exceeds the current threshold, the current limit circuit 610 activates a high-speed turn-off circuit 620 to deactivate (or scale back) the switch device output current. Similarly, an over-voltage circuit 630 can be provided that monitors output voltage of the switch device (e.g., monitored from terminal of switch device 550) with respect to a voltage threshold. If the voltage of the switch device exceeds the voltage threshold, the over-voltage circuit 630 activates a high-speed turn-off circuit to deactivate (or scale back) the switch device output voltage. In some examples, both current limiting action and over-voltage corrective action may be applied concurrently by the respective current limit circuit 610 and over-voltage circuit 630.

Figure 7:
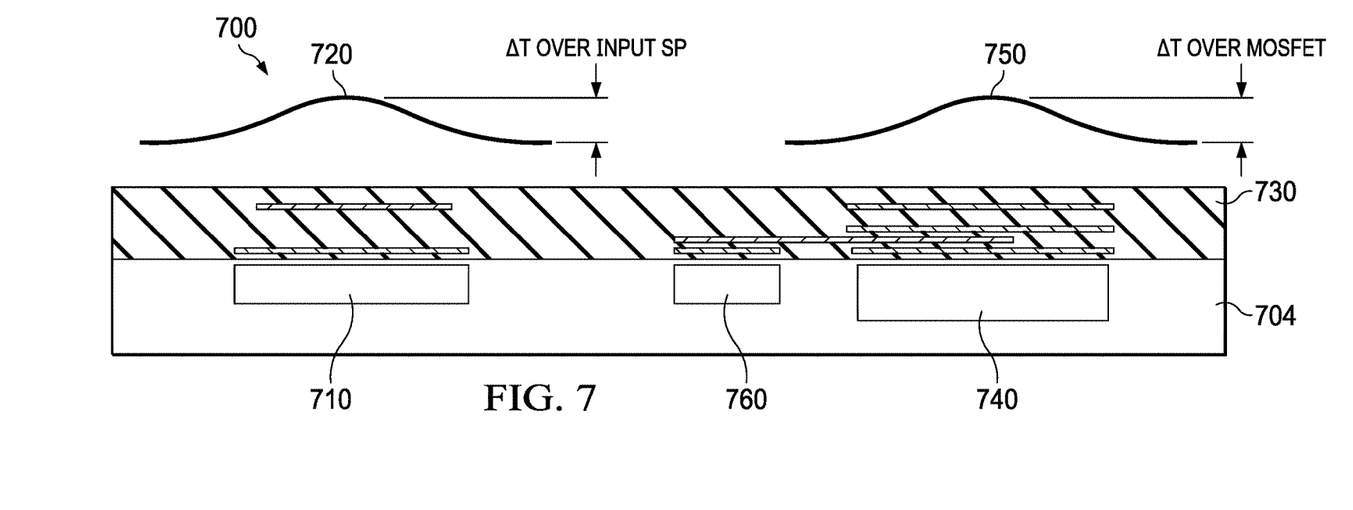
FIG. 7 illustrates an example side-view of an integrated circuit chip having a primary and auxiliary thermopile.

FIG. 7 illustrates an example side-view of an integrated circuit chip 700 having primary thermopile 710 and auxiliary thermopile 760. In this example, a primary thermopile 710 is formed in a substrate 704. The primary thermopile 710 receives a thermal energy 720 from a heater via a dielectric region 730, such as described herein. A MOSFET device 740 is also fabricated on the substrate 704. The MOSFET device 740 generates localized thermal energy when the MOSFET is activated. The auxiliary thermopile 760 is fabricated in a different portion of the substrate 704 from the primary thermopile 710 and is located spatially adjacent to the MOSFET device 740 so as to collect heat generated from the MOSFET. The auxiliary thermopile 760 thus can use heat from the MOSFET in a regenerative manner to generate an output voltage that is added to the voltage from the primary thermopile. The regenerative drive thus can reduce the on resistance of the MOSFET device 740 as well as facilitate that the MOSFET remains on under varying load conditions. Although not shown, one or more other thermopiles could be similarly fabricated on the substrate 704 to either aid the primary thermopile 710 and/or the auxiliary thermopile 760 to increase the heat gathering capabilities of the respective thermopiles and/or to increase the output voltage of a given thermopile. In other examples, additional cells can be added to the thermopiles to increase the heat gathering capabilities of the respective thermopiles and/or to increase the output voltage of a given thermopile.

Figure 8:
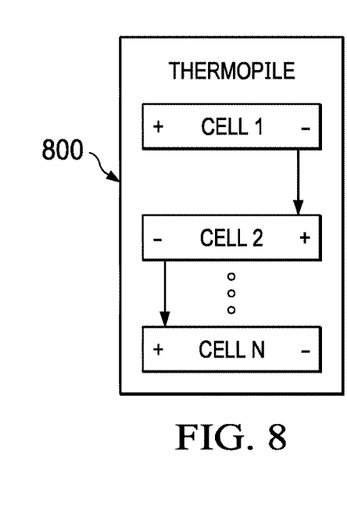
FIG. 8 illustrates an example thermopile that includes a plurality of thermopile cells.

FIG. 8 illustrates an example thermopile 800 (e.g., corresponding to any of the thermopiles disclosed herein FIGS. 1-5 and 7) that includes a plurality of thermopile cells. As shown, the thermopile 800 can be configured as a collection of cells shown as cells 1-N, with N being a positive integer. Each cell 1-N provides a voltage drop shown as + and − across the cell where the cells are ganged (e.g., arranged in series) to form the thermopile 800. As mentioned, the thermopile 800 can be configured as a plurality of cells 1-N that are configured to generate a primary voltage based on thermal energy received from a heat source, which can be applied to activate a switch device (e.g., MOSFET). Example numbers for the cells in the thermopile 800 range from about 10,000 cells per thermopile to about 150,000 cells per thermopile. Other cell numbers are possible depending on the switch device and the thermal efficiencies of the silicon processing regions within the integrated circuit chip.

What have been described above are examples. It is, of course, not possible to describe every conceivable combination of components or methods, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. Additionally, where the disclosure or claims recite "a," "an," "a first," or "another" element, or the equivalent thereof, it should be interpreted to include one or more than one such element, neither requiring nor excluding two or more such elements.

What is claimed is:

1. An integrated circuit device, comprising:
   a substrate having a lateral surface;
   an oxide layer having first and second opposite lateral surfaces, the first lateral surface on the lateral surface of the substrate;
   an intermetal dielectric region having a lateral surface on the second lateral surface of the oxide layer;
   a thermopile cell including:
     a p-doped region in the substrate, the p-doped region including first and second p-type extensions through the oxide layer to the second lateral surface of the oxide layer;
     an n-doped region in the substrate, the n-doped region including first and second n-type extensions through the oxide layer to the second lateral surface of the oxide layer;
   a first metallic connection coupled to the first p-type extension, the first metallic connection extending into the intermetal dielectric region;
   a second metallic connection coupled to the first n-type extension, the second metallic connection extending into the intermetal dielectric region;
   first, second, and third lateral interconnects within the intermetal dielectric region and laterally displaced from one another, the first lateral interconnect coupled to the first and second metallic connections, the second lateral interconnect coupled to the second p-type extension, and the third lateral interconnect coupled to the second n-type extension;

a switch device on the substrate, the switch device having a control input coupled to the second or the third lateral interconnect; and a heater in the intermetal dielectric region overlying and spaced apart from the first lateral interconnect.

2. The integrated circuit device of claim 1, further comprising a faraday metal layer between the heater and the first lateral interconnect, the faraday metal layer overlying the second and third lateral interconnects.

3. The integrated circuit device of claim 1, wherein the first, second, and third lateral interconnects are constructed from a same metal layer.

4. The integrated circuit device of claim 1, wherein the thermopile cell is a first thermopile cell of a thermopile on the substrate, the thermopile including a second thermopile cell coupled to the first thermopile cell via the second and third lateral interconnects.

5. The integrated circuit device of claim 4, further comprising an auxiliary thermopile configured to harvest heat from the switch device when activated and to generate a secondary voltage that is added to a primary voltage generated by the thermopile.

6. The integrated circuit device of claim 1, further comprising an input terminal and a return terminal in which to provide an electrical signal to the heater.

7. The integrated circuit device of claim 1, further comprising a fault circuit configured to monitor an output voltage or current provided by the switch device if activated and to deactivate the switch device if a voltage or current threshold is exceeded.

* * * * *